United States Patent [19]
Clarke et al.

[11] Patent Number: 5,874,862
[45] Date of Patent: Feb. 23, 1999

[54] PHASE-LOCKED LOOPS HAVING TWO AMPLIFIERS FOR DRIVING A VCO

[75] Inventors: David S Clarke, Kingsdown; Ian G. Fobbester, Fairford, both of United Kingdom

[73] Assignee: Plessey Semiconductors Limited, United Kingdom

[21] Appl. No.: 829,719

[22] Filed: Mar. 31, 1997

[30] Foreign Application Priority Data

Apr. 25, 1996 [GB] United Kingdom ............... 9608622

[51] Int. Cl.⁶ .................................................. H03L 7/093
[52] U.S. Cl. .................................. 331/17; 331/8; 331/25
[58] Field of Search .................................. 331/17, 25, 8

[56] References Cited

U.S. PATENT DOCUMENTS

| | | | |
|---|---|---|---|
| 4,208,635 | 6/1980 | Fazakerly et al. | 331/17 |
| 4,243,949 | 1/1981 | Saul et al. | 331/9 |
| 4,278,947 | 7/1981 | Nicollian et al. | 331/1 R |
| 4,506,232 | 3/1985 | Thompson | 331/16 |
| 4,514,706 | 4/1985 | Thompson | 331/16 |
| 4,752,749 | 6/1988 | Moger | 331/17 |
| 4,788,512 | 11/1988 | Hogge, Jr. et al. | 331/4 |
| 4,952,887 | 8/1990 | Ashley | 331/17 |
| 5,121,085 | 6/1992 | Brown | 331/17 |
| 5,369,376 | 11/1994 | Leblebicioglu | 331/8 |
| 5,534,823 | 7/1996 | Kondou | 331/17 |

FOREIGN PATENT DOCUMENTS

| | | |
|---|---|---|
| 0 671 829 A2 | 9/1995 | European Pat. Off. . |
| 2 249 443 | 5/1992 | United Kingdom . |

OTHER PUBLICATIONS

Technique Eases Design of Phase–Locked Loops, EDN Electrical Design News., vol. 35, No. 17, Aug. 20, 1990, Newton, Massachusetts, pp. 141–149.

*Primary Examiner*—Siegfried H. Grimm
*Attorney, Agent, or Firm*—Kirschstein, et al.

[57] ABSTRACT

A phase-locked loop employing a charge pump 7 for synthesizing RF channels permits a low supply voltage to be used by using two amplifier stages 5a, 5b, between the charge pump and a VCO4. Stage 5a may be a high impedance common emitter pair of complementary transistors allowing a wide voltage swing. Stage 5b may be an operational amplifier with resistive feedback to provide gain less than unity and a low impedance output to provide feedback around a loop filter 6 to source the current from charge pump 7 entering an inverting input of stage 5a. Alternatively, stages 5a, 5b may be reversed.

8 Claims, 3 Drawing Sheets ize PNP transistors are
PHASE-LOCKED LOOPS HAVING TWO AMPLIFIERS FOR DRIVING A VCO

BACKGROUND OF THE INVENTION

This invention relates to phase-locked loops.

The invention especially relates to phase-locked loops used for synthesizing RF channel frequencies in a transceiver, especially a transceiver used in WLAN (Wireless Local Area Network) applications. One application of the latter is in portable terminals such as lap-tops, point-of-sale terminals, which communicate with a host processor, and the transceiver may be accommodated in a standard PC expansion card such as a PCMCIA (Personal Computer Memory Card International Association)-sized card. This has a standard supply voltage of 3.0 volts ±10%, and the minimum supply voltage of 2.7 volts results in limitations in the implementation of the phase-locked loop.

Thus, in many conventional phase-locked loop synthesizers, a charge pump circuit is used to directly drive the voltage controlled oscillator (VCO), the loop filter components being connected from the charge pump circuit output to ground as shown in FIG. 1. The phase detector 1 provides either positive pulses from current source 2 or negative pulses from current source 3 to the voltage controlled oscillator 4, depending on whether the voltage controlled oscillator is at a higher or lower frequency than the reference oscillator. A bipolar charge pump using all NPN transistors for use with high frequency circuits has been proposed (GB-B-2 249 443), because PNP transistors are either not available or have poor performance. In this case, the charge pump circuit is followed by an operational amplifier to maintain the charge pump output at a constant voltage, and the operational amplifier output provides the VCO control voltage. When the VCO frequency range is wide, in the case of the low supply voltages referred to, it may be necessary to swing the amplifier output very close to the supply rails in order to obtain the necessary tuning range from the VCO.

A conventional operational amplifier will use a complementary output stage as shown in FIG. 2, but this will reduce the available swing at the output by at least twice the diode drop (equal to around 1.6 volts in total) which represents a considerable voltage in the case of a nominal 3 volts supply. An alternative output stage as shown in FIG. 3 uses complementary transistors in common emitter (rather than common collector as shown in FIG. 2) mode, and this reduces the voltage loss to only a few hundred millivolts if the output stage is properly designed. However, in the process, the output impedance is raised compared to FIG. 2, and this makes it difficult to restrain the charge pump output at the virtual earth input voltage of the operational amplifier.

In addition, if a charge pump circuit using all NPN transistors was employed in conjunction with an operational amplifier having the output stage shown in FIG. 3, this would be difficult to realise in practice, because the charge pump output current must be relatively high (pulses of at least ±1 milliamp duration 10 ns to 1 μs at 1 MHz) for good noise performance, and this current would have to be sourced from the amplifier output under transient conditions if the loop settling time was not to be affected. In many high frequency processes, the size of the PNP transistor of the complementary pair shown in FIG. 3 needed to source 1 milliamp with reasonable gain would be excessive.

SUMMARY OF THE INVENTION

The invention provides a phase-locked loop which includes a voltage controlled oscillator, amplifier means for driving the voltage controlled oscillator and a charge pump circuit having an output for pulses which vary in polarity according to the phase error between signals derived from the output of the voltage controlled oscillator and from a reference oscillator, wherein the amplifier means comprises a first amplifier connected to the output of the charge pump circuit to receive the pulses and a second amplifier in series with the first amplifier, the output of one of the amplifiers being capable of swinging over a major portion of the potential difference between the supply rails, and being connected to the voltage controlled oscillator to control its frequency, and the other amplifier having a low impedance output connected by a loop filter to the output of the charge pump circuit.

By splitting the usual loop amplifier into two parts it is possible to provide both a high voltage swing for the voltage controlled oscillator and the low output impedance high output current needed for use with a charge pump circuit.

BRIEF DESCRIPTION OF THE DRAWINGS

A phase-locked loop constructed in accordance with the invention will now be described by way of example, with reference to the accompanying drawings, in which.

DETAILED DESCRIPTION OF THE PREFERRED EMBODIMENTS

Figure 1:
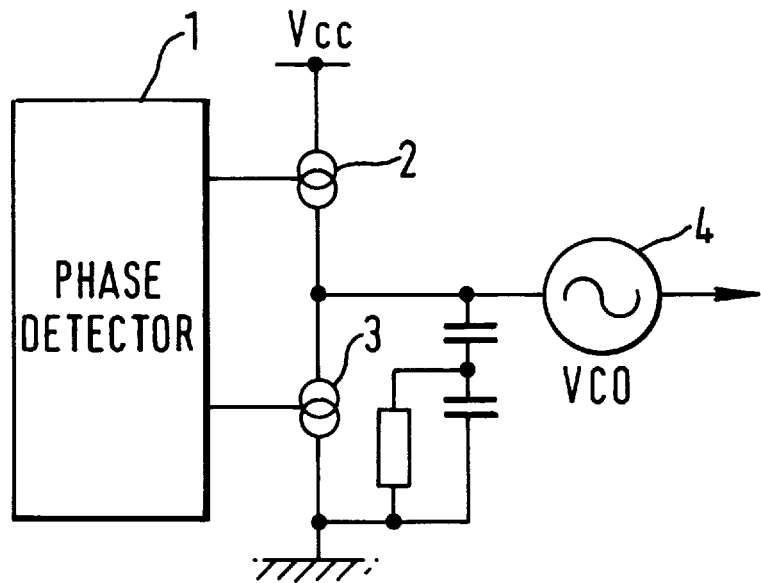
FIG. 1 is a block circuit diagram of part of a conventional phase-locked loop.
Figure 2:
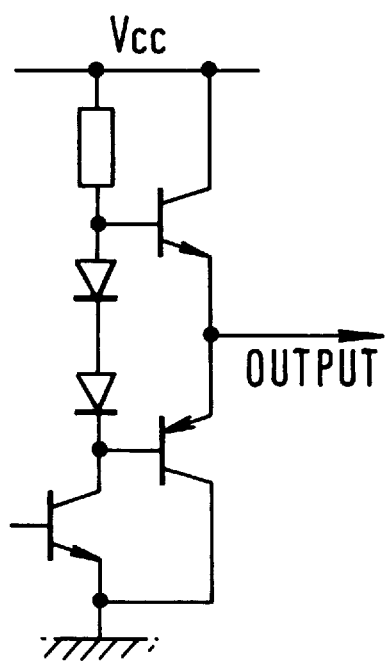
FIG. 2 is a typical output stage of an operational amplifier.
Figure 3:
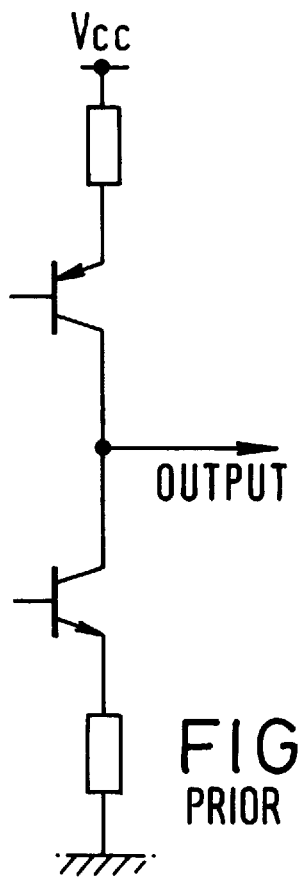
FIG. 3 is another typical output stage providing a wider voltage swing.
Figure 4:
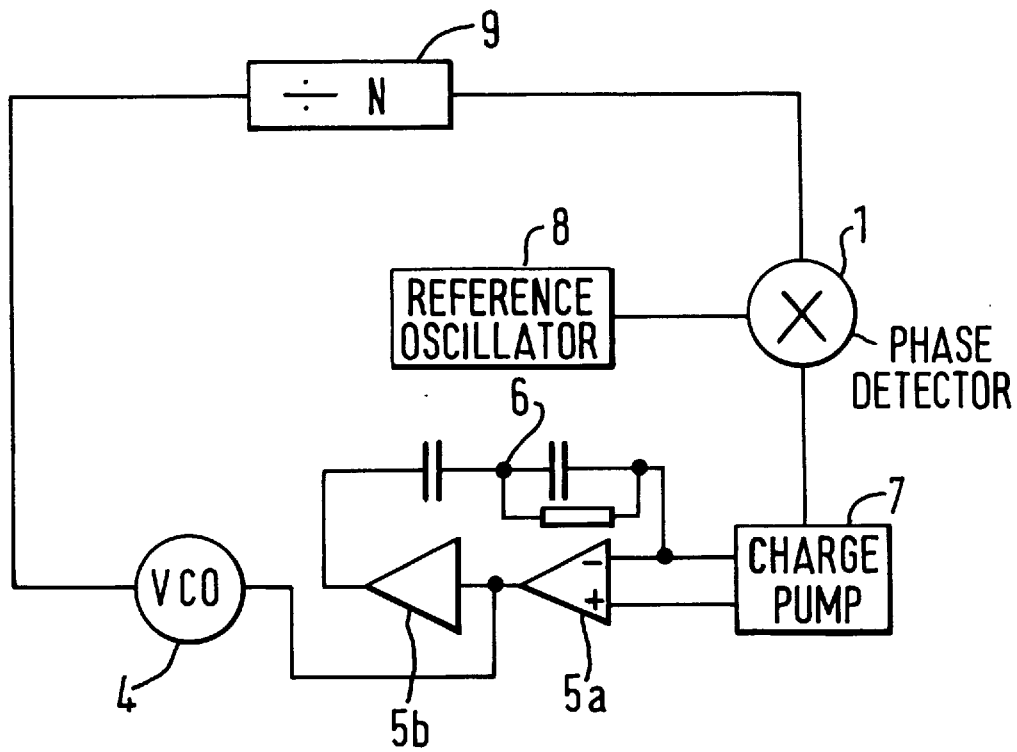
FIG. 4 is a block circuit diagram of a first form of phase-locked loop according to the invention.

Referring to FIG. 4, the phase-locked loop forms the local oscillator for synthesizing RF channels in a transceiver used in a WLAN system. The transceiver is contained in a PMCIA-sized card arranged to fit in a portable terminal such as a lap-top or point-of-sale terminal, in order to communicate with a host processor. The frequency of communication could be within the range 2.4 to 2.5 GHz. The VCO would be typically tunable over the range 2.05 to 2.15 GHz. The standard supply voltage is 3 volts ±10% and therefore may be as little as 2.7 volts.

The RF channels are synthesized at the output of VCO 4 which receives its control voltage from amplifier means in the form of first amplifier 5a in series with second amplifier 5b implemented as an operational amplifier the inverting input of which has a third order filter 6 in a feedback path to its output. The inverting input is connected to a charge pump 7 and the non-inverting input is connected to a reference voltage in charge pump 7. The inverting input is controlled by phase detector 1. The latter compares the phase of a reference oscillator 8 with the output of the VCO divided down by counter 9. The divide-by ratio of the counter may be incremented or decremented in order to allow the loop to lock to a different output frequency. The charge pump 7 supplies pulses to the operational amplifier which vary in width and polarity according to the phase error but are always of constant amplitude. The charge pump may be implemented as shown in GB-B-2 249 443.

Figure 5:
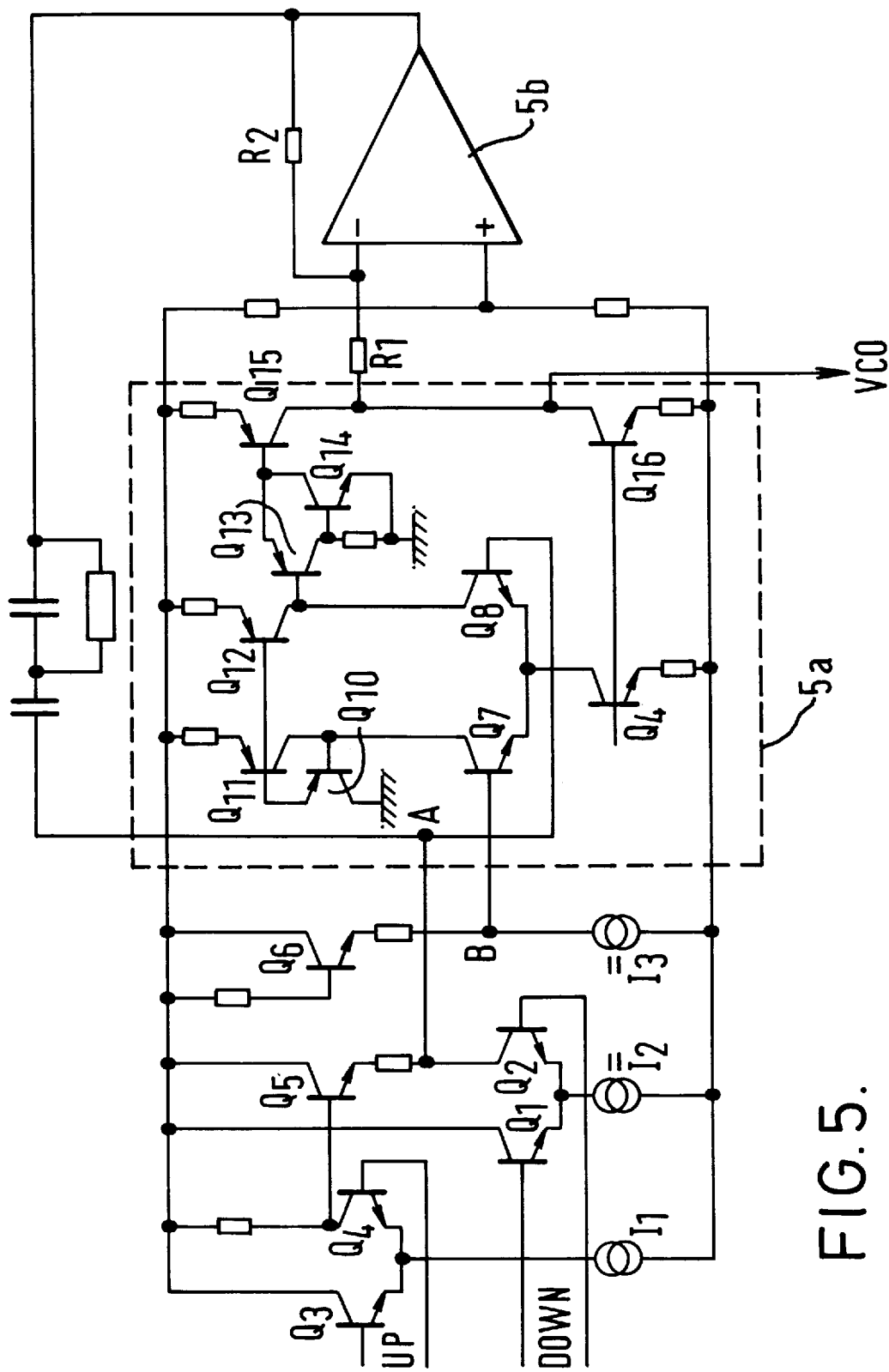
FIG. 5 shows a part of the charge pump and the amplifier means of FIG. 4 in more detail.

The pulses passing from the charge pump 7 to the non-inverting input of the operational amplifier 5a, 5b may be generated at the rate of 1 MHz, and may extend in length from 10 ns to 1 $\mu$s, and the amplitude may be ±1 milliamp. The charge pump uses only NPN transistors because on an integrated circuit process PNP transistors may not be available or may be limited in gain and frequency response preventing very rapid switching of the current. As is shown in FIG. 5, in response to "up" pulses from the phase detector corresponding to the reference oscillator phase, say, leading the VCO output phase, differential pair of transistors Q3, Q4 biased by current source $I_1$ drive transistor Q5 to provide output pulses at A (the inverting input of the operational amplifier 5a) of one polarity, and in response to the reference oscillator lagging the VCO, "down" pulses are generated by differential transistor pair Q1, Q2 biased by $I_2$ and also fed to A. B, the non-inverting input of the operational amplifier 5a, is a reference set by transistor Q6 biased by current source $I_3$. Q1 to Q6 are NPN. A is a virtual earth. Stage 5a is a high voltage gain stage with high output impedance using a common emitter output stage to provide an almost rail to rail swing, and the output is connected to the control voltage input of the voltage controlled oscillator 4. The differential inputs between A, B are applied to a differential NPN pair Q7, Q8 biased by Q9 having respectively transistors Q10, Q11 and Q12 in the collector loads. The collector output of Q8 is fed via Q13, Q14 to the base of common emitter output stage Q15, Q16 and the output is fed to the control voltage input of the VCO as mentioned above.

This output could not be connected to the inverting input A via the loop filter directly because voltage excursions at A would be imposed on this output and, because of its high impedance, would affect the level of A. Accordingly, the operational amplifier 5a, 5b has a second stage 5b consisting of an all-NPN low impedance output stage which provides the current needed at A.

The amplifier stages are connected via resistor R1, and stage 5b which is a conventional operational amplifier has resistive feedback R2, and the ratio of R2:R1 is set at less than unity, typically a third, to provide a gain of that value. Because of this, the output can only swing, say, over half the supply voltage and therefore problems of the output stage saturating do not occur. Stage 5b may employ only NPN transistors.

Figure 6:
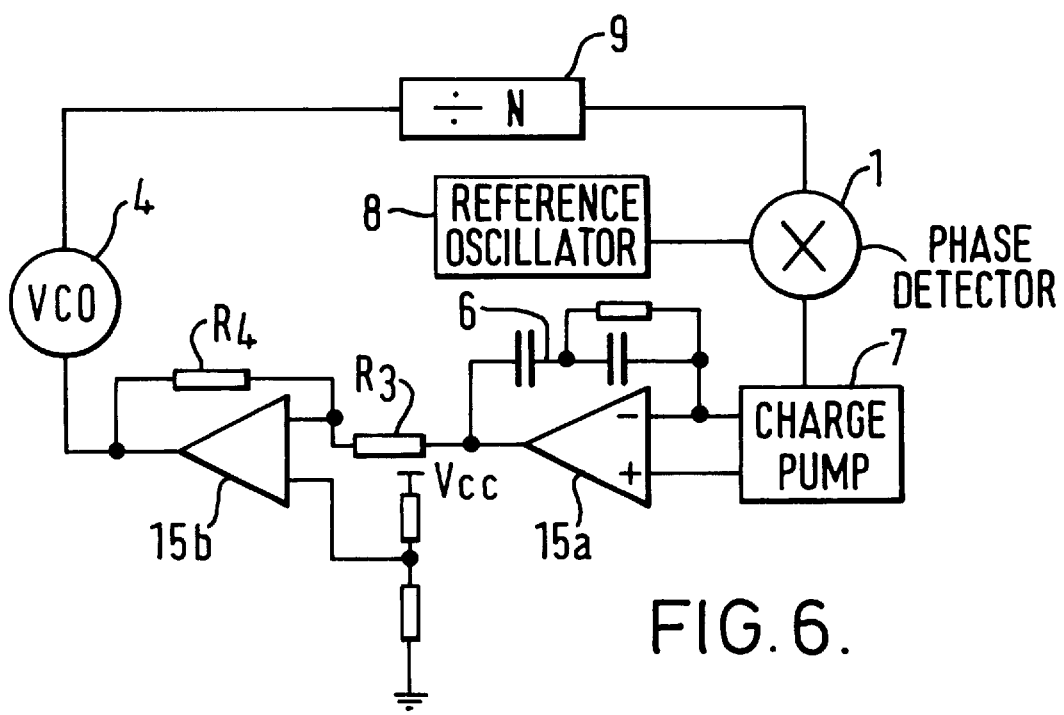
FIG. 6 is a block circuit diagram of a second form of phase-locked loop according to the invention.

In the second form of phase-locked loop, the loop consists (FIG. 6) of voltage-controlled oscillator 4, divide-by-N counter 9, reference oscillator 8, phase detector 1 and charge pump 7 and operational amplifier as for the first form, but the stages 15a, 15b of the amplifier are reversed compared to the stages 5a, 5b of the first form. Thus, the first amplifier 15a is conventional with a low impedance output stage driving the loop filter 6 and providing a high current drive signal at the output to source the charge pump output current, swinging about Vcc–2Vbe, followed by a second amplifier with a high output voltage swing and high output impedance to drive the voltage controlled oscillator. The ratio of R3 to R4 may be such as to provide a gain of typically ×3 for the second amplifier 15b, the other input of the second amplifier being connected to a voltage reference.

Of course, variations may be made without departing from the scope of the invention. Thus, the phase-locked loop need not be for synthesizing RF frequency channels.

We claim:

1. A phase-locked loop which includes a voltage controlled oscillator, amplifier means for driving the voltage controlled oscillator and a charge pump circuit having an output for pulses which vary in polarity according to the phase error between signals derived from the output of the voltage controlled oscillator and from a reference oscillator, wherein the amplifier means comprises a first amplifier connected to the output of the charge pump circuit to receive the pulses and a second amplifier in series with the first amplifier, the output of one of the amplifiers being capable of swinging over a major portion of the potential difference between the supply rails, and being connected to the voltage controlled oscillator to control its frequency, and the other amplifier having a low impedance output connected by a loop filter to the output of the charge pump circuit.

2. A phase-locked loop as claimed in claim 1, in which the amplifier the output of which is connected to the voltage controlled oscillator has a high impedance output.

3. A phase-locked loop as claimed in claim 1, in which the amplifier the output of which is connected to the voltage controlled oscillator is the first amplifier.

4. A phase-locked loop as claimed in claim 3, in which the second amplifier has resistive feedback of such a magnitude that the gain of the amplifier is less than unity.

5. A phase-locked loop as claimed in claim 4, in which the amplifiers are connected by resistive means.

6. A phase-locked loop as claimed in claim 4, in which the second amplifier uses only NPN transistors.

7. A phase-locked loop as claimed in claim 1, in which the output stage of the amplifier the output of which is connected to the voltage controlled oscillator is a complementary PNP NPN common emitter configuration.

8. A transceiver having a phase-locked loop for synthesizing RF channels as claimed in claim 1.

* * * * *